(12) United States Patent
Ueda

(10) Patent No.: US 11,756,808 B2
(45) Date of Patent: *Sep. 12, 2023

(54) PLASMA PROCESSING APPARATUS

(71) Applicant: TOKYO ELECTRON LIMITED, Tokyo (JP)

(72) Inventor: Takehiro Ueda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 42 days.

This patent is subject to a terminal disclaimer.

(21) Appl. No.: 17/386,645

(22) Filed: Jul. 28, 2021

(65) Prior Publication Data

US 2021/0358779 A1 Nov. 18, 2021

Related U.S. Application Data

(62) Division of application No. 16/273,765, filed on Feb. 12, 2019, now Pat. No. 11,121,010.

(30) Foreign Application Priority Data

Feb. 15, 2018 (JP) ................................. 2018-024777
Oct. 9, 2018 (JP) ................................. 2018-190589

(51) Int. Cl.
*H01L 21/67* (2006.01)
*H01L 21/687* (2006.01)
(Continued)

(52) U.S. Cl.
CPC .... *H01L 21/67126* (2013.01); *H01J 37/3244* (2013.01); *H01J 37/32532* (2013.01);
(Continued)

(58) Field of Classification Search
None
See application file for complete search history.

(56) References Cited

U.S. PATENT DOCUMENTS 5,848,670 A 12/1998 Salzman
6,887,317 B2 5/2005 Or
(Continued)

FOREIGN PATENT DOCUMENTS

JP 2008270721 A * 11/2008
JP 2008270721 A 11/2008
JP 2013-42012 A 2/2013

*Primary Examiner* — Karla A Moore
*Assistant Examiner* — Margaret Klunk
(74) *Attorney, Agent, or Firm* — WEIHROUCH IP

(57) ABSTRACT

A plasma processing apparatus includes an insertion member having a first surface facing a vacuum space, a second surface facing a non-vacuum space, and an insertion hole penetrating through the first and second surfaces. A pin is inserted into the insertion hole and moved vertically. A movable member is provided in a recess formed on a wall surface of the insertion hole facing the pin. The movable member has an opening into which the pin is inserted and is movable along a surface of the recess. A first sealing member is provided between the movable member and the pin. A second sealing member is provided between the movable body and the surface of the recess and allows, when a pressing force of the pin that locally compresses the first sealing member acts on the first sealing member, the movable member to move in a direction to release the pressing force.

14 Claims, 8 Drawing Sheets

(51) Int. Cl.
*H01L 21/3065* (2006.01)
*H01J 37/32* (2006.01)

(52) U.S. Cl.
CPC .... *H01L 21/3065* (2013.01); *H01L 21/68735* (2013.01); *H01L 21/68742* (2013.01); *H01L 21/68764* (2013.01)

(56) References Cited

U.S. PATENT DOCUMENTS

| | | |
|---|---|---|
| 11,121,010 B2 * | 9/2021 | Ueda ................. H01L 21/67126 |
| 2007/0169891 A1 * | 7/2007 | Koshiishi .......... H01L 21/68757 |
| | | 156/345.47 |
| 2010/0163403 A1 | 7/2010 | Kitada et al. |
| 2011/0031111 A1 * | 2/2011 | Kobayashi ........ H01J 37/32623 |
| | | 204/298.36 |
| 2013/0101241 A1 | 4/2013 | Hou et al. |
| 2013/0180662 A1 | 7/2013 | Sato et al. |
| 2014/0202635 A1 | 7/2014 | Yamaguchi et al. |
| 2014/0213055 A1 * | 7/2014 | Himori ............. H01L 21/68742 |
| | | 438/689 |
| 2014/0216332 A1 | 8/2014 | Omori et al. |
| 2017/0032987 A1 * | 2/2017 | Lee .................. H01L 21/68735 |

* cited by examiner

PLASMA PROCESSING APPARATUS

CROSS-REFERENCE TO RELATED APPLICATIONS

This application is a divisional of U.S. patent application Ser. No. 16/273,765, filed Feb. 12, 2019, which claims priority to Japanese Patent Application Nos. 2018-024777 and 2018-190589 respectively filed on Feb. 15, 2018 and Oct. 9, 2018, the entire contents of which are incorporated herein by reference.

FIELD OF THE INVENTION

The present disclosure relates to a plasma processing apparatus.

BACKGROUND OF THE INVENTION

Conventionally, there is known a plasma processing apparatus for performing plasma processing on a target object such as a wafer or the like by using plasma. Such a plasma processing apparatus includes a mounting table for mounting thereon a target object serving as an electrode in a processing chamber where a vacuum space can be formed, for example. The plasma processing apparatus perform the plasma processing on the target object mounted on the mounting table by applying a predetermined high frequency power to the mounting table in the vacuum space formed in the processing chamber. An insertion hole is formed in the mounting table to penetrate through a surface of the mounting table which faces the vacuum space and a bottom surface thereof, and a pin is inserted into the insertion hole. In the plasma processing apparatus, when the target object is transferred, the pin projects from the insertion hole and separates the target object from the mounting table while supporting the backside of the target object.

A sealing member such as an O-ring or the like is provided along a circumferential direction of the insertion hole on a wall surface of the insertion hole which faces the pin. The sealing member is brought into contact with the pin, thereby sealing the insertion hole. In the plasma processing apparatus, the airtightness of the vacuum space in the processing chamber is maintained by sealing the insertion hole with the sealing member (see, e.g., Japanese Patent Application Publication No. 2013-42012).

SUMMARY OF THE INVENTION

In view of the above, the present disclosure provides a technique capable of adequately sealing an insertion hole into which a pin is inserted.

In accordance with an aspect, there is provided a plasma processing apparatus comprising: an insertion member having a first surface facing a vacuum space, a second surface facing a non-vacuum space, and an insertion hole penetrating through the first surface and the second surface; a pin that is inserted into the insertion hole and moved vertically; a movable member that is provided in a recess formed on a wall surface of the insertion hole which faces the pin, the movable member having an opening into which the pin is inserted and being movable in the recess along a surface of the recess which intersects with an axial direction of the pin; a first sealing member provided between the movable member and the pin; and a second sealing member provided between the movable body and the surface of the recess and configured to allow, when a pressing force of the pin that locally compresses the first sealing member acts on the first sealing member, the movable member to move in a direction in which the pressing force is released.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Hereinafter, embodiments of the plasma processing apparatus of the present disclosure will be described in detail with reference to the accompanying drawings. The embodiments are not intended to limit the present disclosure.

Conventionally, there is known a plasma processing apparatus for performing plasma processing on a target object such as a wafer or the like by using plasma. Such a plasma processing apparatus includes a mounting table for mounting thereon a target object serving as an electrode in a processing chamber where a vacuum space can be formed, for example. The plasma processing apparatus perform the plasma processing on the target object mounted on the mounting table by applying a predetermined high frequency power to the mounting table in the vacuum space formed in the processing chamber.

Figure 8:
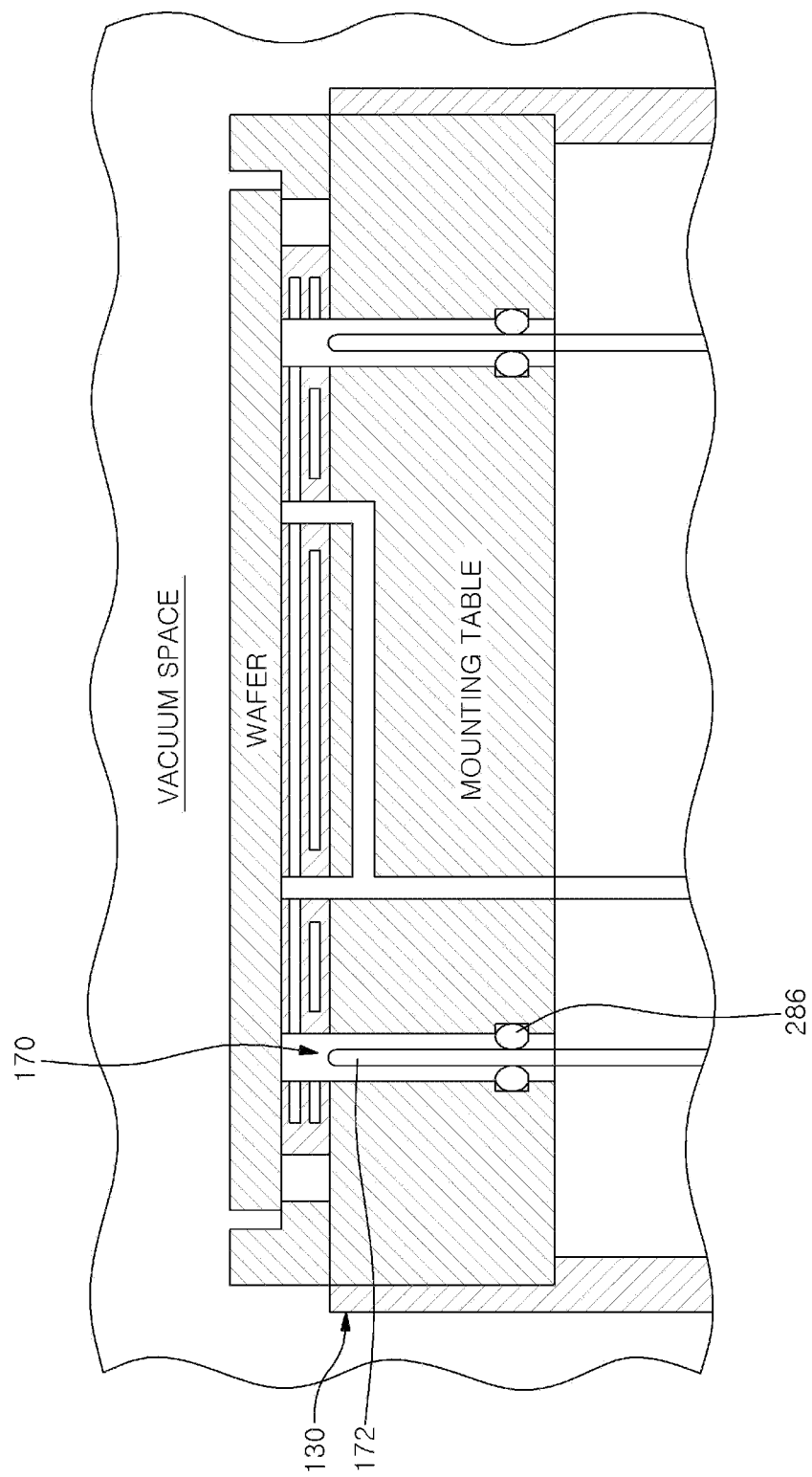
FIG. 8 is a schematic cross-sectional view showing a configuration of a main part of a conventional mounting table.

Here, a configuration of principal parts of a conventional mounting table 130 will be described with reference to FIG. 8. FIG. 8 is a schematic cross-sectional view showing the configuration of the principal parts of the mounting table 130 in the conventional technique. As shown in FIG. 8, an insertion hole 170 is formed in the mounting table 130 to penetrate through a surface of the mounting table 130 which faces the vacuum space and a bottom surface thereof, and a pin 172 is inserted into the insertion hole 170. In the plasma processing apparatus, when a wafer as a target object is transferred, the pin 172 protrudes from the insertion hole 170 and separates the wafer from the mounting table 130 while supporting a backside of the wafer.

A sealing member 286 such as an O-ring or the like is provided along a circumferential direction of the insertion hole 170 on a wall surface of the insertion hole 170 which faces the pin 172. The sealing member 286 is brought into contact with the pin 172, thereby sealing the insertion hole 170. In the plasma processing apparatus, the airtightness of the vacuum space in the processing chamber is maintained by sealing the insertion hole 170 with the sealing member 286.

In the plasma processing apparatus, when a temperature of the mounting table is controlled depending on types of the plasma processing, the mounting table expands or contracts due to temperature changes. If the mounting table expands or contracts, an axis of the pin and an axis of the insertion hole of the mounting table are deviated. Accordingly, a pressing force of the pin that locally compresses the sealing member acts on the sealing member provided in the insertion hole. When the sealing member is locally compressed, a gap may be generated between an uncompressed portion of the sealing member and the pin, which makes it difficult to sufficiently seal the insertion hole. For example, in an example shown in FIG. 8, the mounting table 130 expands in a radial direction of the mounting table 130 due to the changes in the temperature. Thus, the sealing member 286 is locally compressed, and a gap may be generated between an uncompressed portion of the sealing member 286 and the pin 172. Such a problem may occur in other components having an insertion hole into which the pin is inserted, other than the mounting table. When the insertion hole is not adequately sealed, the airtightness of the vacuum space in the processing chamber may deteriorate.

First Embodiment

<Configuration of Plasma Processing Apparatus>

Figure 1:
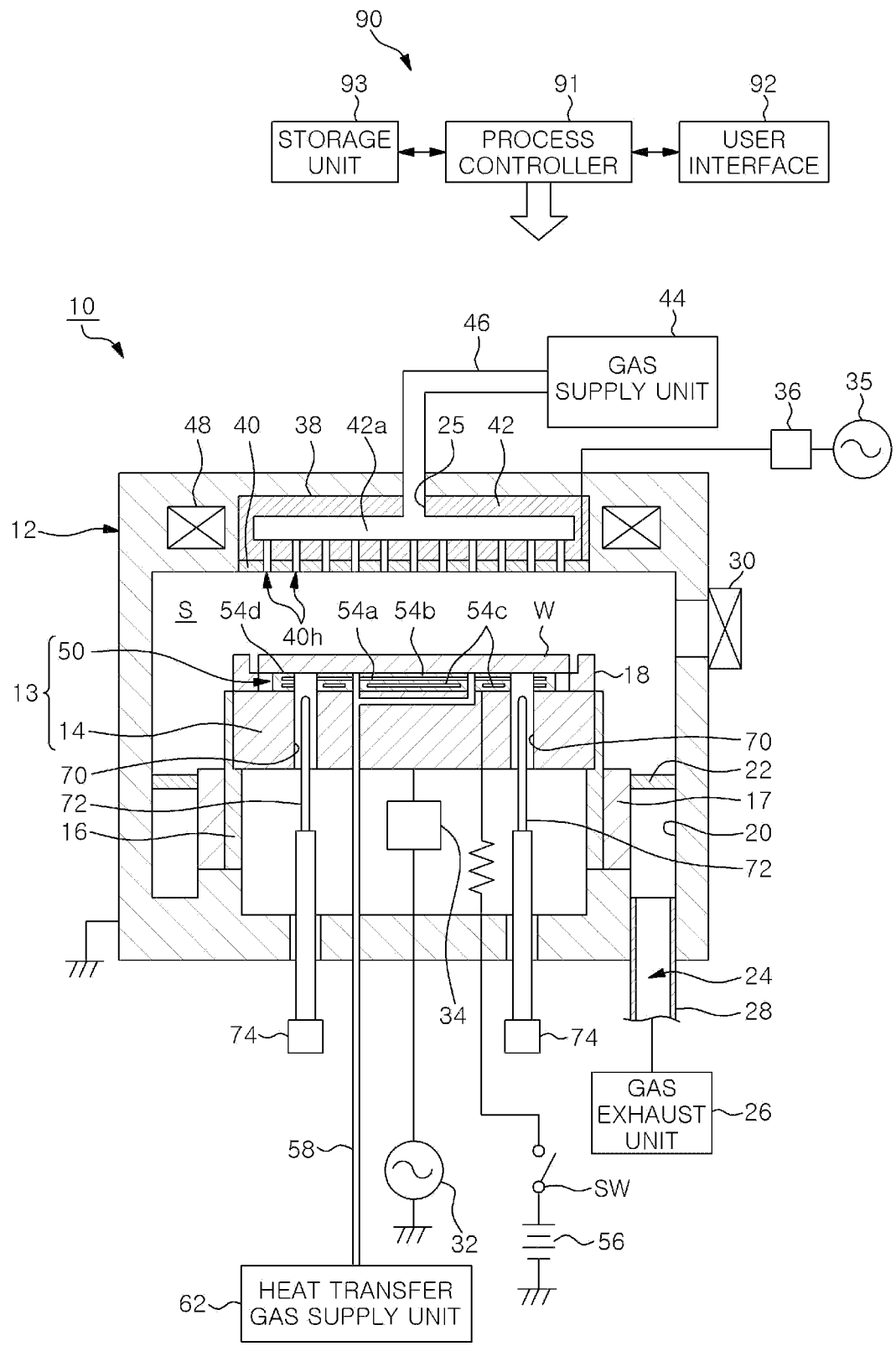
FIG. 1 shows a schematic configuration of a plasma processing apparatus according to a first embodiment.

FIG. 1 shows a schematic configuration of a plasma processing apparatus according to a first embodiment. In FIG. 1, there is illustrated a cross section of the plasma processing apparatus according to the first embodiment.

As shown in FIG. 1, the plasma processing apparatus 10 is a parallel plate type plasma processing apparatus. The plasma processing apparatus 10 includes an airtight processing chamber 12. The processing chamber 12 is formed in a substantially cylindrical shape, and has therein a processing space S where plasma is generated. The plasma processing apparatus 10 includes a mounting table 13 in the processing chamber 12. An upper surface of the mounting table 13 serves as a mounting surface 54*d* on which a semiconductor wafer (hereinafter, referred to as "wafer") W as a target object is mounted. In the present embodiment, the mounting table 13 includes a base 14 and an electrostatic chuck 50. The base 14 has a substantially disc shape and is provided below the processing space S. The base 14 is made of, e.g., aluminum, and serves as a lower electrode.

The electrostatic chuck 50 is provided on an upper surface of the base 14. The upper surface of the electrostatic chuck 50 has a flat disc shape and corresponds to the mounting surface 54*d* on which the wafer W is mounted. The electrostatic chuck 50 has an electrode 54*a* and an insulator 54*b*. The electrode 54*a* is provided in the insulator 54*b*, and a DC power supply 56 is connected to the electrode 54*a* via a switch SW. When a DC voltage is applied from the DC power supply 56 to the electrode 54*a*, a Coulomb force is generated, and the wafer W is attracted and held on the electrostatic chuck 50 by the Coulomb force. The electrostatic chuck 50 has a heater 54*c* in the insulator 54*b*. The heater 54*c* heats the electrostatic chuck 50 by power supplied from a power supply mechanism (not shown). Accordingly, the temperatures of the mounting table 13 and the wafer W are controlled.

In the present embodiment, the plasma processing apparatus 10 further includes a cylindrical holding part 16 and a cylindrical supporting part 17. The cylindrical holding part 16 holds the base 14 while being in contact with edges of a side surface and a bottom surface of the base 14. The cylindrical supporting part 17 extends vertically from a bottom portion of the processing chamber 12 and supports the base 14 via the cylindrical holding part 16.

A focus ring 18 is provided on an upper surface of a peripheral portion of the base 14. The focus ring 18 is a member for improving in-plane uniformity of processing accuracy for the wafer W. The focus ring 18 is a substantially annular plate-shaped member, and is made of, e.g., silicon, quartz, or silicon carbide.

In the present embodiment, a gas exhaust path 20 is formed between a sidewall of the processing chamber 12 and the cylindrical supporting part 17. A baffle plate 22 is provided at an inlet of the gas exhaust path 20 or in the gas exhaust path 20. A gas exhaust port 24 is provided at a bottom portion of the gas exhaust path 20. The gas exhaust port 24 is defined by a gas exhaust line 28 fitted in the bottom portion of the processing chamber 12. A gas exhaust unit 26 is connected to the gas exhaust line 28. The gas exhaust unit 26 includes a vacuum pump, and can reduce the pressure in the processing space S in the processing chamber 12 to a predetermined vacuum level by operating the vacuum pump. Accordingly, the processing space S in the processing chamber 12 is maintained in a vacuum atmosphere. The processing space S is an example of the vacuum space. A gate valve 30 for opening/closing a loading/unloading port of the wafer W is attached to the sidewall of the processing chamber 12.

A high frequency power supply 32 is electrically connected to the base 14 via a matching unit 34. The high frequency power supply 32 generates a power for plasma generation, and applies a high frequency power of a predetermined high frequency (e.g., 13 MHz) to the lower electrode, i.e., the base 14. A coolant path (not shown) is formed in the base 14. The plasma processing apparatus 10 cools the mounting table 13 by circulating the coolant through the coolant path. As a result, the temperatures of the mounting table 13 and the wafer W are controlled.

A plurality of, e.g., three, pin insertion holes 70 is provided in the mounting table 13 (only two pin insertion holes 70 are shown in FIG. 1), and pins 72 are respectively inserted into the pin insertion holes 70. The pins 72 are connected to a driving mechanism 74 and driven vertically by the driving mechanism 74. The configuration of the mounting table 13 which includes the pin insertion holes 70 and the pins 72 will be described later.

The plasma processing apparatus 10 further includes a shower head 38 in the processing chamber 12. The shower head 38 is provided above the processing space S. The shower head 38 includes an electrode plate 40 and an electrode holder 42.

The electrode plate 40 is a conductive plate having a substantially disc shape and serves as an upper electrode. A high frequency power supply 35 is electrically connected to the electrode plate 40 via a matching unit 36. The high frequency power supply 35 is a power supply for plasma generation and applies a high frequency power of a predetermined high frequency (e.g., 60 MHz) to the electrode plate 40. When the high frequency powers are respectively supplied to the base 14 and the electrode plate 40 by the high frequency power supplies 32 and 35, a high frequency electric field is formed in the space, i.e., in the processing space S, between the base 14 and the electrode plate 40, and plasma is generated.

A plurality of gas injection holes 40h is formed in the electrode plate 40. The electrode plate 40 is detachably held by the electrode holder 42. A buffer space 42a is provided in the electrode holder 42. The plasma processing apparatus 10 further includes a gas supply unit 44. The gas supply unit 44 is connected to a gas inlet port 25 of the buffer space 42a through a gas supply conduit 46. The gas supply unit 44 supplies a processing gas to the processing space S. The processing gas may be, e.g., an etching gas or a film forming gas. The electrode holder 42 has a plurality of holes connected to the respective gas injection holes 40h, and the holes communicate with the buffer space 42a. The gas supplied from the gas supply unit is supplied to the processing space S via the buffer space 42a and the gas injection holes 40h.

In the present embodiment, a magnetic field forming mechanism 48 that extends annularly or concentrically is provided at a ceiling portion of the processing chamber 12. The magnetic field forming mechanism 48 has a function of facilitating start of high frequency discharge (plasma ignition) in the processing space S and stably maintaining the discharge.

In the present embodiment, the plasma processing apparatus 10 further includes a gas supply line 58 and a heat transfer gas supply unit 62. The heat transfer gas supply unit 62 is connected to the gas supply line 58. The gas supply line 58 extends to an upper surface of the electrostatic chuck 50 and extends annularly on the upper surface. The heat transfer gas supply unit 62 supplies a heat transfer gas, e.g., He gas, to a gap between the upper surface of the electrostatic chuck 50 and the wafer W.

The operation of the plasma processing apparatus 10 configured as described above is integrally controlled by a control unit 90. The control unit 90 includes a process controller 91 having a CPU (Central Processing Unit) and configured to control the respective components of the plasma processing apparatus 10, a user interface 92, and a storage unit 93.

The user interface 92 includes a keyboard through which a process manager inputs commands to manage the plasma processing apparatus 10, a display for visualizing and displaying an operation status of the plasma processing apparatus 10, and the like.

The storage unit 93 stores a recipe in which a control program (software) for controlling the plasma processing apparatus 10 to perform various processes under the control of the process controller 91, processing condition data and the like are recorded. If necessary, a predetermined recipe is read-out from the storage unit 93 by an instruction from the user interface 92 or the like and executed by the process controller 91. Accordingly, a desired process is performed in the plasma processing apparatus 10 under the control of the process controller 91. The recipe such as the control program, the processing condition data and the like may be stored in a computer-readable storage medium (e.g., a hard disk, a CD, a flexible disk, a semiconductor memory or the like.) Alternately, the recipe such as the control program, the processing condition data and the like can be transmitted from another device, e.g., through a dedicated line, in real time and used online.

<Configuration of Mounting Table 13>

Figure 2:
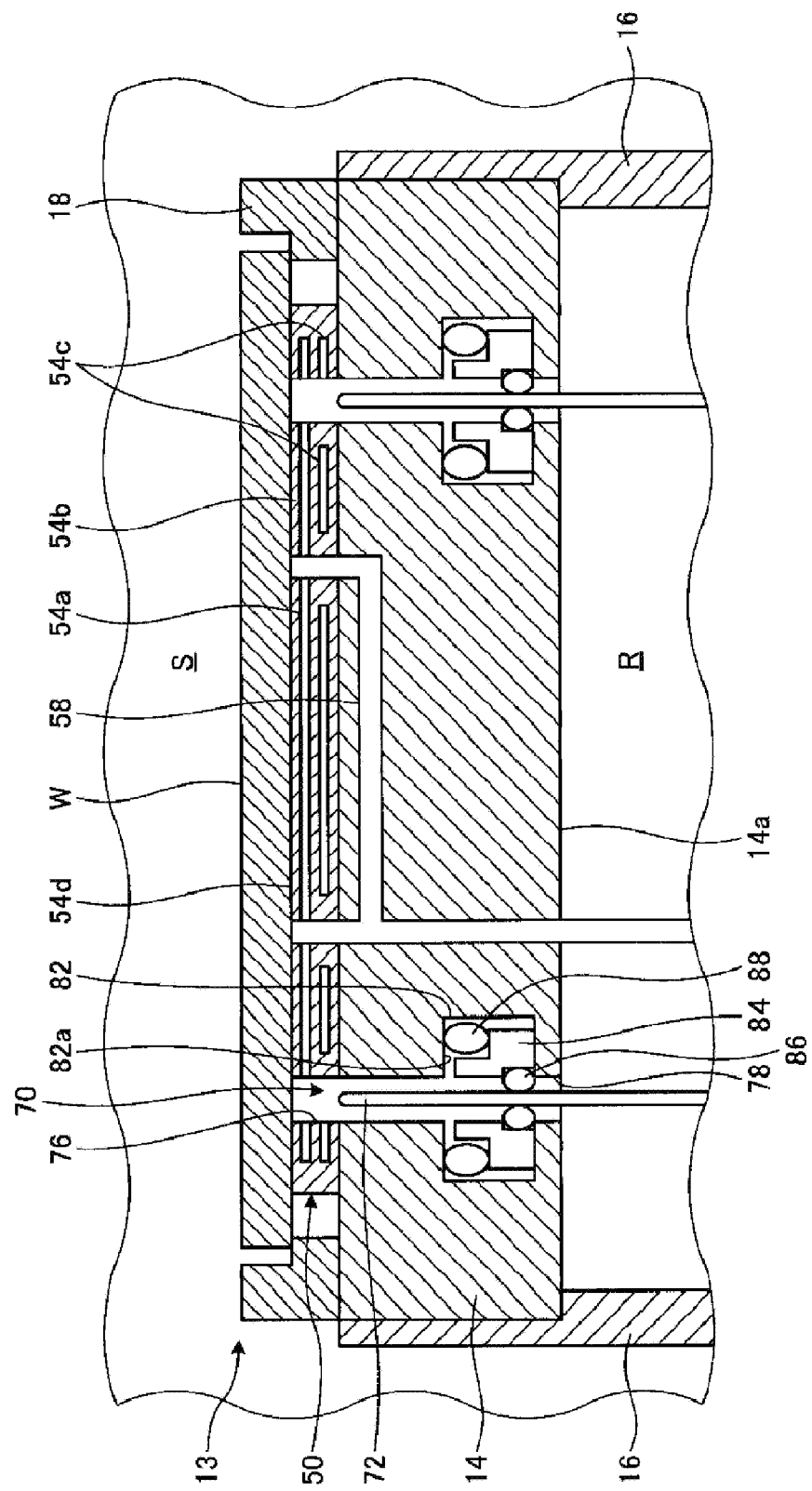
FIG. 2 is a schematic cross-sectional view showing a configuration of principal parts of a mounting table according to the first embodiment.

Next, the configuration of principal parts of the mounting table 13 according to the first embodiment will be described with reference to FIG. 2. FIG. 2 is a schematic cross-sectional view showing the configuration of the principal parts of the mounting table 13 according to the first embodiment. As described above, the mounting table 13 includes the base 14 and the electrostatic chuck 50, and the pins 72 can pass through the mounting table 13 from a position below the base 14 to a position above the electrostatic chuck 50. The mounting table 13 is an example of an insertion member.

The electrostatic chuck 50 is formed in a disc shape and supported by the base 14. The upper surface of the electrostatic chuck 50 serves as the mounting surface 54d on which the wafer W is mounted. The upper surface of the base 14 is bonded to a bottom surface of the electrostatic chuck 50. A bottom surface of the base 14 serves as an opposite surface 14a of the mounting surface 54d.

The pin insertion holes 70 into which the pins 72 are inserted are formed in the mounting surface 54d. The pin insertion holes 70 penetrate through the mounting surface 54d and the opposite surface 14a of the mounting surface 54d. The pin insertion hole 70 includes a first through-hole 76 and a second through-hole 78. The first through-hole 76 is formed in the electrostatic chuck 50, and the second through-hole 78 is formed in the base 14. A recess 82 is formed on a wall surface of the pin insertion hole 70 which faces the pin 72.

The pins 72 are connected to the driving mechanisms 74 shown in FIG. 1 and moved vertically through the pin insertion holes 70 by the driving mechanisms 74 to protrude beyond and retreat below the mounting surface 54d of the mounting table 13. In other words, in a state where the pins 72 are raised, tip end portions of the pins 72 protrude beyond the mounting surface 54d of the mounting table 13 and support the wafer W. On the other hand, in a state in which the pins 72 are lowered, the tip end portions of the pins 72 are accommodated in the pin insertion holes 70 and the wafer W is mounted on the mounting surface 54d.

A movable member 84 is provided in the recess 82 of the pin insertion hole 70. The movable member 84 has an opening into which the pin 72 is inserted, and is movable in the recess 82 along an upper surface 82a of the recess 82 which intersects with an axial direction of the pin 72.

A first sealing member 86 is disposed between the movable member 84 and the pin 72. In the pin insertion hole 70, a gap formed between the movable member 84 and the pin 72 that moves vertically through the pin insertion hole 70 is sealed with the first sealing member 86. The first sealing member 86 is, e.g., Omni seal (Registered Trademark), or an O-ring.

A second sealing member 88 is disposed between the movable member 84 and the upper surface 82a of the recess 82. In the pin insertion hole 70, a gap formed between the movable member 84 and the upper surface 82a of the recess 82 is sealed with the second sealing member 88. The second sealing member 88 is, e.g., Omni seal (Registered Trademark), or an O-ring.

The upper surface of the mounting table 13 serves as the mounting surface 54d on which the wafer W is mounted. The bottom surface of the mounting table 13 serves as the opposite surface 14a of the mounting surface 54d. The mounting surface 54d of the mounting table 13 is disposed to face the processing space S that is a vacuum space maintained in a vacuum atmosphere. On the other hand, the opposite surface 14a of the mounting table 13 is disposed to face a non-vacuum space that is maintained in an atmospheric atmosphere. The non-vacuum space is, e.g., a space R surrounded by an inner surface of the cylindrical holding part 16. The processing space S and the space R communicate with each other through the pin insertion holes 70. In the plasma processing apparatus 10, the inflow of the atmosphere in the space R into the processing space S (i.e., the vacuum space in the processing chamber 12) is suppressed by sealing the pin insertion holes 70 with the first sealing member 86 and the second sealing member 88.

In the plasma processing apparatus 10, when the temperature of the mounting table 13 is controlled depending on types of plasma processing, the mounting table 13 expands or contracts due to temperature changes. If the mounting table 13 expands or contracts, the axis of the pin 72 and the axis of the pin insertion hole 70 of the mounting table 13 are deviated. Accordingly, a pressing force from the pin 72 that locally compresses the first sealing member 86 acts on the first sealing member 86. When the first sealing member 86 is locally compressed, a gap may be generated between an uncompressed portion of the first sealing member 86 and the pin 72, which makes it difficult to sufficiently seal the pin insertion hole 70.

Figure 3:
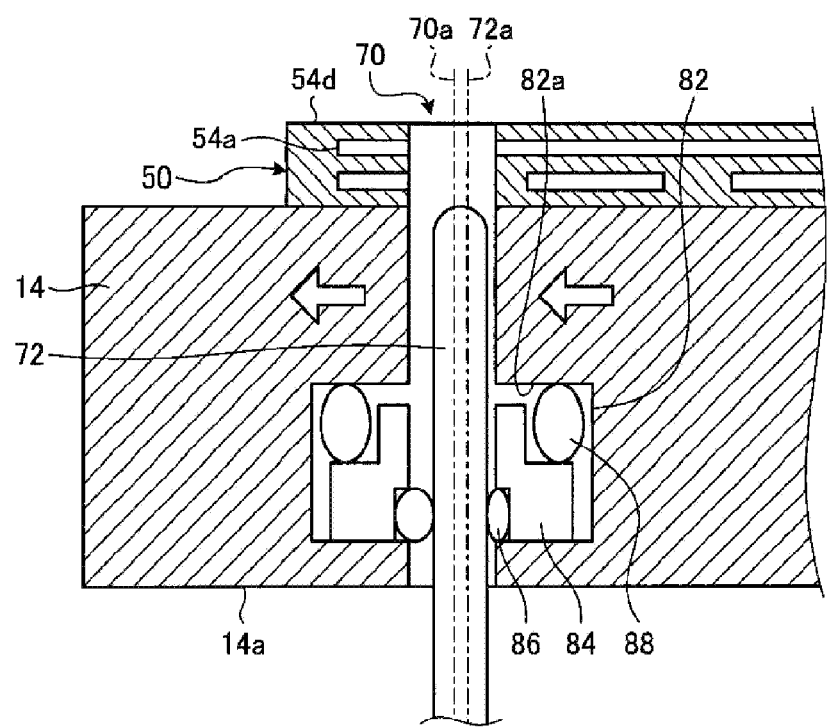
FIG. 3 explains deviation between an axis of a pin and an axis of a pin insertion hole of the mounting table.

FIG. 3 explains the deviation between the axis of the pin insertion hole 70 and the axis of the pin 72 of the mounting table 13. The mounting table 13 has the mounting surface 54d and the opposite surface 14a of the mounting surface 54d. The pin insertion hole 70 penetrating through the mounting surface 54d and the opposite surface 14a of the mounting surface 54d is formed in the mounting table 13. The temperature of the mounting table 13 is controlled by a heater 54c of the electrostatic chuck 50 and the coolant path (not shown) of the base 14. In the plasma processing apparatus 10, when the temperature of the mounting table 13 is controlled, the mounting table 13 expands or contracts due to the temperature changes. In the present embodiment, it is assumed that the mounting table 13 expands due to the temperature changes. For example, in the plasma processing apparatus 10, the mounting table 13 expands in a radial direction of the mounting table 13 due to the temperature changes. In FIG. 3, the mounting table 13 expands in a direction indicated by a white arrow. When the mounting table 13 expands in the radial direction of the mounting table 13, an axis 70a of the pin insertion hole 70 of the mounting table 13 is deviated in the radial direction of the mounting table 13 from an axis 72a of the pin 72. Therefore, the first sealing member 86 is pressed against the pin 72 by the mounting table 13, the second sealing member 88, and the movable member 84. Accordingly, a pressing force of the pin 72 that locally compresses the first sealing member 86 acts, as a reaction force against the force that presses the first sealing member 86 against the pin 72, on the first sealing member 86. In FIG. 3, the pressing force that locally compresses the first sealing member 86 acts in a direction opposite to the expansion direction of the mounting table 13 (i.e., the direction indicated by the white arrow), and a right portion of the first sealing member 86 is locally compressed by pin 72. If the right portion of the first sealing member 86 is locally compressed, a gap is generated between an uncompressed left portion of the first sealing member 86 and the pin 72, and the inflow of the atmosphere through the gap may occur.

Therefore, in the plasma processing apparatus 10, when the pressing force that locally compresses the first sealing member 86 acts on the first sealing member 86 from the pin 72, the second sealing member 88 allows the movable member 84 to move in a direction in which the pressing force is released. For example, as shown in FIG. 3, when the pressing force that locally compresses the first sealing member 86 acts in a direction opposite to the expansion direction (i.e., the direction indicated by the white arrow) of the mounting table 13, the second sealing member 88 slides along the upper surface 82a of the recess 82 in a direction opposite to the expansion direction of the mounting table 13, thereby allowing the movement of the movable member 84.

Accordingly, the pressing force that locally compresses the first sealing member 86 is released, which makes it possible to prevent a gap from being generated between an uncompressed left portion of the first sealing member 86 and the pin 72. As a result, in the plasma processing apparatus 10, the pin insertion holes 70 can be adequately sealed with the first sealing member 86 and the second sealing member 88 even when the axes of the pins 72 and the axes of the pin insertion holes 70 of the mounting table 13 are deviated from each other.

As described above, the plasma processing apparatus 10 according to the first embodiment includes the mounting table 13, the pins 72, the movable member 84, the first sealing member 86, and the second sealing member 88. The mounting table 13 has the mounting surface 54d facing the vacuum space and the opposite surface 14a facing the non-vacuum space, and the pin insertion holes 70 are formed in the mounting table 13 to penetrate through the mounting surface 54d and the opposite surface 14a. The pins 72 are inserted into the pin insertion holes 70 and move vertically. The movable member 84 is provided in the recess 82 formed on the wall surface of the pin insertion hole 70 which faces the pin 72 inserted thereinto. The movable member 84 is movable along the upper surface 82a of the recess 82 which intersects with the axial direction of the pin 72. The first sealing member 86 is disposed between the movable member 84 and the pin 72. The second sealing member 88 is disposed between the movable member 84 and the upper surface 82a of the recess 82, and allows the movable member 84 to move in a direction in which the pressing force is released when the pressing force of the pin 72 that locally compresses the first sealing member 86 acts on the first sealing member 86. Accordingly, in the plasma processing apparatus 10, the pin insertion holes 70 can be adequately sealed with the first sealing member 86 and the second sealing member 88 even when the axes of the pin insertion holes 70 of the mounting table 13 and the axes of the pin 72 are deviated due to expansion or contraction of the mounting table 13.

Hereinafter, an evaluation test that has been conducted to examine the effect of the plasma processing apparatus 10 according to the first embodiment will be described.

<Evaluation Apparatus>

Figure 6:
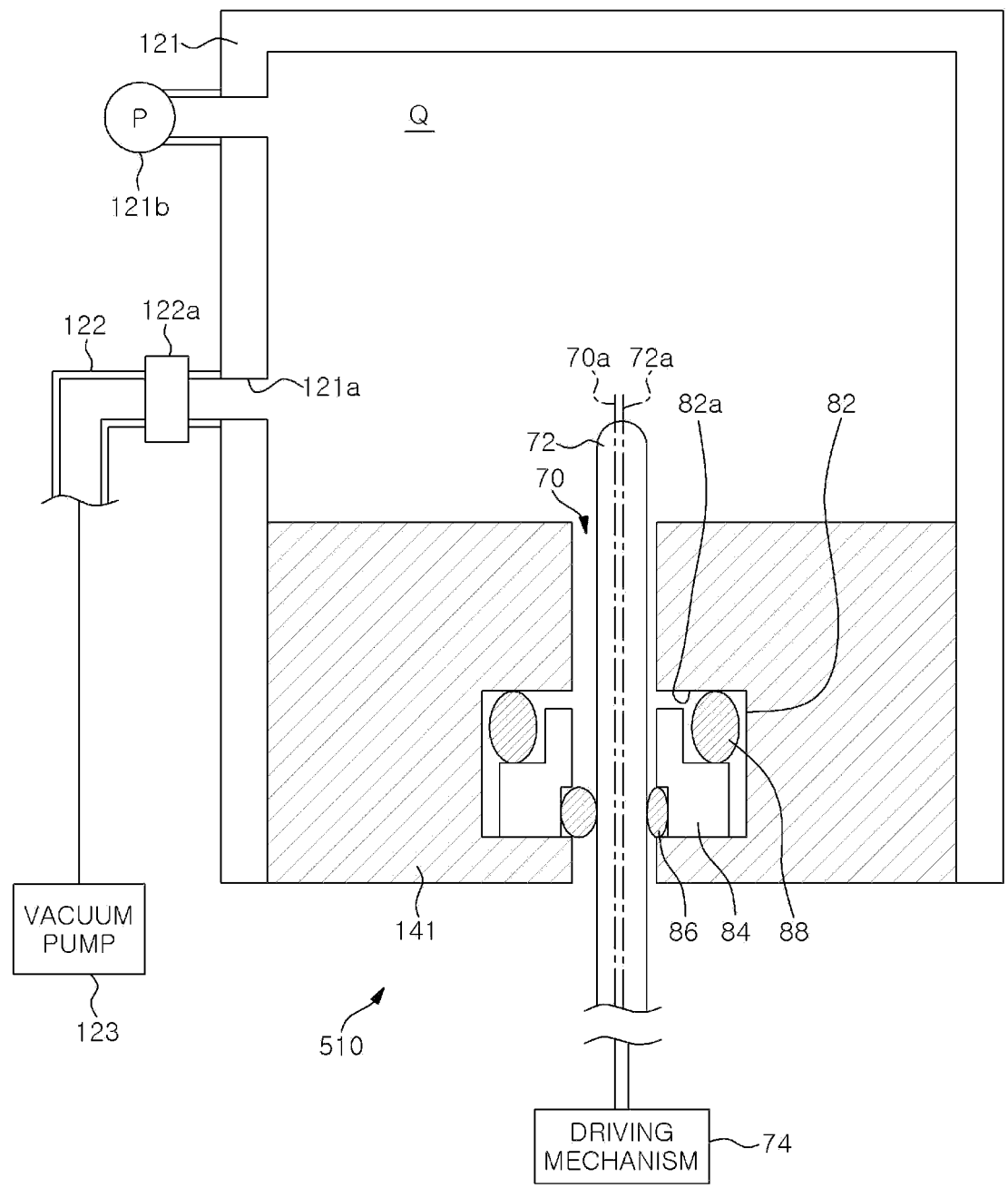
FIG. 6 shows a configuration example of an evaluation device.

First, an evaluation device 500 used for the evaluation test will be described. FIG. 6 shows a configuration example of the evaluation apparatus 500. The evaluation apparatus 500 shown in FIG. 6 includes a test container 121. The test container 121 is formed in a substantially cylindrical shape and has an opening at a bottom portion thereof. A sample 510 is attached to the opening of the test container 121. By attaching the sample 510 to the opening of the test container 121, a space Q is generated in the test container 121.

The sample 510 includes a base plate 141, a pin 72, a movable member 84, a first sealing member 86, and a second sealing member 88. The base plate 141, the pin 72, the movable member 84, the first sealing member 86 and the second sealing member 88 correspond to the mounting table 13, the pin 72, the movable member 84, the first sealing member and the second sealing member 88 shown in FIG. 2, respectively.

A gas exhaust port 121a is formed at a sidewall of the test container 121, and a vacuum pump 123 is connected to the gas exhaust port 121a through a gas exhaust line 122. An opening/closing valve 122a is provided in the gas exhaust line 122. The vacuum pump 123 is configured to reduce the pressure in the test container 121 to a predetermined vacuum level. The vacuum level (pressure) of the test container 121 is measured by a pressure gauge 121b.

<Evaluation Test>

In the evaluation test, the amount of air flowing into the space Q through the pin insertion hole 70 of the base plate 141 (hereinafter, referred to as "the amount of leakage") was measured by sequentially performing the following steps (1) to (6). The sample 510 corresponds to the plasma processing apparatus 10 according to the first embodiment.

Step (1): A vacuum level of the test container 121 is reduced to about 2.5 Pa by the vacuum pump 123.

Step (2): The axis 72a of the pin 72 is deviated in a radial direction of the base plate 141 from the axis 70a of the pin insertion hole 70 of the base plate 141.

Step (3): The opening/closing valve 122a is closed.

Step (4): The pin 72 is vertically reciprocated within a range of 5 mm by the driving mechanism 74 100 times for 10 minutes.

Step (5): After the step (4) is executed for 10 minutes, the vacuum level (pressure) of the test container 121 is measured by the pressure gauge 121b.

Step (6): the amount of leakage ($Pa \cdot m^3/sec$) is calculated by multiplying the volume of the test container 121 by the increase in the vacuum level (pressure) of the test container 121 during the 10 minutes (=600 seconds) in which the step (4) is executed.

<Comparative Test>

In a comparative test, the amount of leakage was measured by attaching a comparative sample to the evaluation apparatus 500 and sequentially performing the above-described steps (1) to (6). The comparative sample corresponds to the plasma processing apparatus including the conventional mounting table 130 (see FIG. 8), and is different from the sample 510 in that a single sealing member 286 is provided around the pin 72, instead of the movable member 84, the first sealing member 86 and the second sealing member 88.

Figure 7:
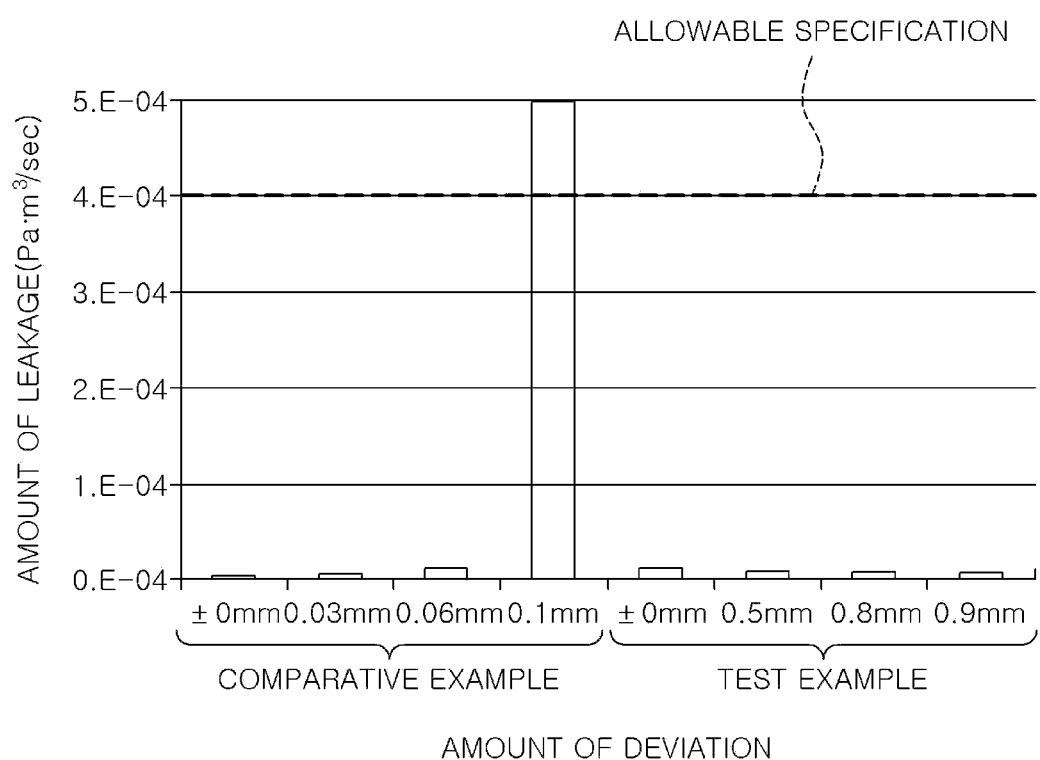
FIG. 7 shows an example of relation between the amount of deviation of the axis of the pin and the amount of leakage.

FIG. 7 shows an example of the relation between the amount of deviation of the axis 72a of the pin 72 and the amount of leakage. FIG. 7 shows the result of measuring the amount of leakage while varying the amount of deviation of the axis 72a of the pin 72. In FIG. 7, "Comparative Example" is the amount of leakage corresponding to the comparative test, and "Test Example" is the amount of leakage corresponding to the evaluation test.

As shown in FIG. 7, in the comparative test, when the amount of deviation of the axis 72a of the pin 72 was 0.1 mm, the amount of leakage exceeded a predetermined allowable specification range. On the other hand, in the evaluation test, even when the amount of deviation of the axis 72a of the pin 72 was 0.9 mm, the amount of leakage was within the predetermined allowable specification range. In other words, even when the axis 70a of the pin insertion hole 70 of the mounting table 13 and the axis 72a of the pin 72 are deviated from each other, the pin insertion hole 70 can be adequately sealed with the first sealing member 86 and the second sealing member 88.

Second Embodiment

Next, a second embodiment will be described. The plasma processing apparatus 10 according to the second embodiment has the same configuration as that of the plasma processing apparatus 10 according to the first embodiment except for the configuration of the mounting table 13. Therefore, in the second embodiment, like reference numerals will be used for like parts corresponding to those in the first embodiment, and redundant description thereof will be omitted.

<Configuration of Mounting Table 13>

Figure 4:
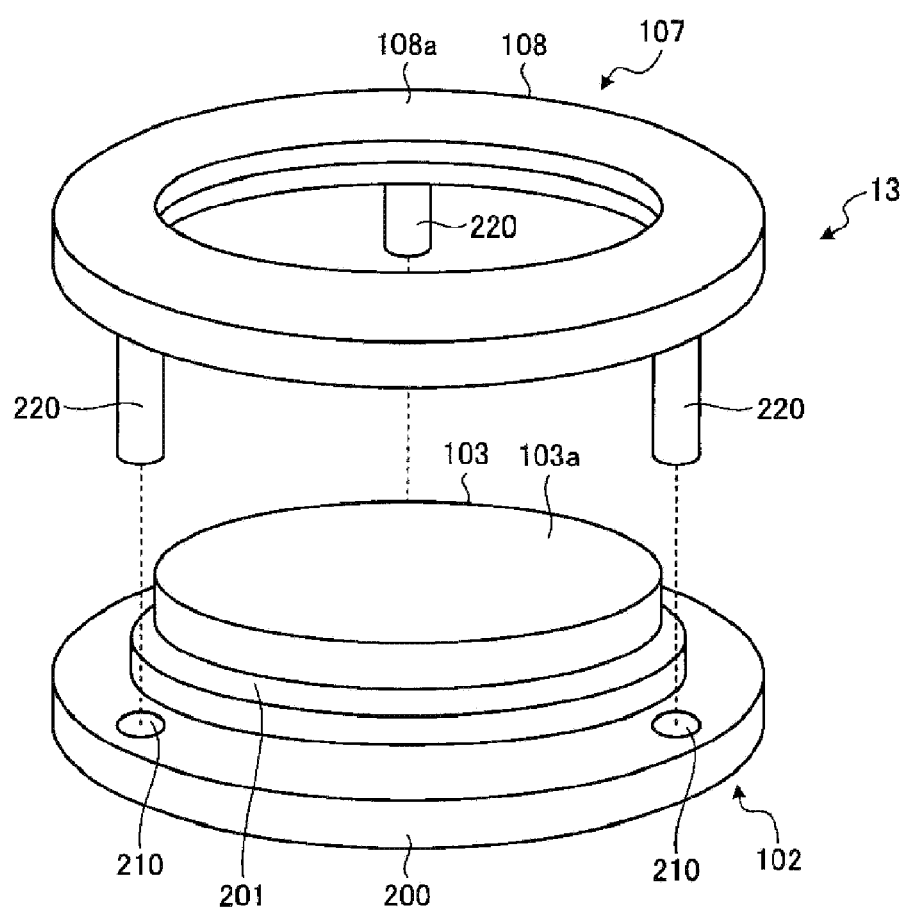
FIG. 4 is a perspective view showing a configuration of principal parts of a mounting table according to a second embodiment.

The configuration of the principal parts of the mounting table 13 according to the second embodiment will be described with reference to FIGS. 4 and 5. FIG. 4 is a perspective view showing the configuration of the principal parts of the mounting table 13 according to the second embodiment. As shown in FIG. 4, the mounting table 13 includes a first mounting table 102 and a second mounting table 107 provided at an outer periphery of the first mounting table 102. The first mounting table 102 and the second mounting table 107 are arranged to be coaxial with each other.

The first mounting table 102 includes a base 103. The base 103 is formed in a cylindrical shape. The above-described electrostatic chuck 50 is provided on a surface 103a in an axial direction of the base 103. The base 103 is provided with a flange portion 200 that protrudes outwards along the outer periphery. The base 103 according to the present embodiment is provided with a middle protrusion 201 with a larger outer diameter that protrudes outwards from the middle portion of the side surface of the outer periphery, and the flange portion 200 that protrudes outwards from a lower part of the middle protrusion 201. A through-hole 210 is formed at three or more positions in the circumferential direction of the upper surface of the flange portion 200 to penetrate therethrough in an axial direction. In the flange portion 200 according to the present embodiment, the three through-holes 210 are formed at regular intervals in the circumferential direction. The through-holes 210 function as pin insertion holes into which pins 220 to be described later are inserted. The first mounting table 102 is an example of an insertion member.

The second mounting table 107 includes a base 108. The base 108 is formed in a cylindrical shape whose inner diameter is greater than an outer diameter of the surface 103a of the base 103 by a predetermined size, and the above-described focus ring 18 is provided on one surface 108a in an axial direction of the base 108. The pins 220 are provided at the bottom surface of the base 108 at the same regular intervals as those of the through-holes 210 of the flange portion 200. The three pins 220 are fixed to the bottom surface of the base 108 according to the present embodiment at regular intervals in the circumferential direction. The base 108 is an example of a common member.

The base 108 is disposed on the flange portion 200 of the base 103 such that the axis of the base 108 coincides with the axis of the base 103 and the pins 220 of the base 108 are circumferentially aligned with the through-holes 210 of the base 103 to be inserted the respective through-holes 210.

Figure 5:
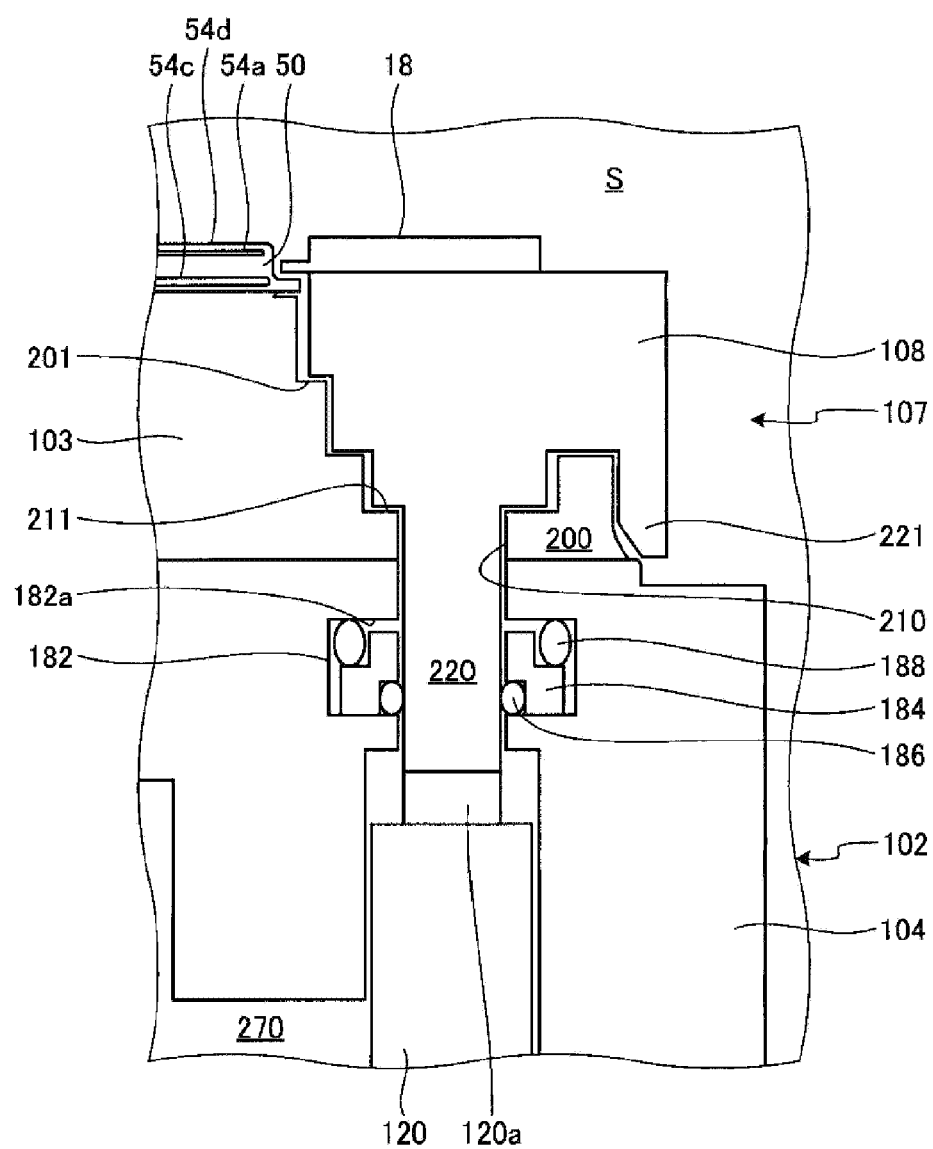
FIG. 5 is a schematic cross-sectional view showing a configuration of principal parts of a first mounting table and a second mounting table according to the second embodiment.

FIG. 5 is a schematic cross-sectional view showing the configuration of the principal parts of the first mounting table 102 and the second mounting table 107 according to the second embodiment. The example of FIG. 5 shows the cross sections of the first mounting table 102 and the second mounting table 107 viewed from the position of the through-hole 210.

The base 103 is supported by an insulating supporting table 104. The through-hole 210 is formed in the base 103 and the supporting table 104.

The through-hole 210 has an upper section of a larger diameter and a lower section of a smaller diameter, and has a stepped portion 211. The pin 220 is formed to correspond to the through-hole 210, and thus has an upper section of a larger diameter and a lower section of a smaller diameter.

The base 108 is disposed on the flange portion 200 of the base 103. The base 108 has an outer diameter greater than that of the base 103, and is provided with an annular portion 221 protruding downward at a portion of the bottom surface facing the base 103 which has a larger diameter than that of the base 103. When the base 108 is disposed on the flange portion 200 of the base 103, the annular portion 221 covers the side surface of the flange portion 200.

The pins 220 are inserted into the respective through-holes 210. Each through-hole 210 is provided with a lift mechanism 120 for vertically moving the second mounting table 107. For example, in the base 103, the lift mechanism 120 for vertically moving the pin 220 is provided at the lower part of each through-hole 210. The lift mechanism 120 has an actuator, and vertically moves the pin 220 by expanding and contracting a rod 120a by a driving force of the actuator. The pin 220 moves vertically in the through-hole 210 by the vertical movement of the lift mechanism 120.

A recess 182 is formed on a wall surface of the through-hole 210 which faces the pin 220. A movable member 184 is provided in the recess 182. The movable member 184 has an opening through which the pin 220 is inserted, and is movable along an upper surface 182a of the recess 182 which intersects with the axial direction of the pin 220.

A first sealing member 186 is disposed between the movable member 184 and the pin 220. In the through-hole 210, a gap between the movable member 184 and the pin 220 that moves vertically in the through-hole 210 is sealed with the first sealing member 186. The first sealing member 186 is, e.g., Omni seal (Registered Trademark) or an O-ring.

A second sealing member 188 is disposed between the movable member 184 and the upper surface 182a of the recess 182. In the through-hole 210, a gap between the movable member 184 and the upper surface 182a of the recess 182 is sealed with the second sealing member 188. The second sealing member 188 is, e.g., Omni seal (registered trademark) or an O-ring.

A lower space in the first mounting table 102 is maintained in an atmospheric atmosphere. For example, a space 270 is formed at a lower part of the supporting table 104 and maintained in an atmospheric atmosphere. The upper surface of the first mounting table 102 (e.g., the upper surface of the flange portion 200 of the base 103) faces the processing space S that is a vacuum space maintained in a vacuum atmosphere. On the other hand, the bottom surface of the first mounting table 102 (e.g., the bottom surface of the supporting table 104) faces the space 270 that is a non-vacuum space maintained in an atmospheric atmosphere. The processing space S and the space 270 communicate with each other through the through-holes 210. In the plasma processing apparatus 10, the inflow of the atmosphere in the space 270 into the processing space S (i.e., the vacuum space inside the processing chamber 12) is suppressed by sealing the through-holes 210 with the first sealing member 186 and the second sealing member 188.

In the plasma processing apparatus 10, when three pins 220 are fixed to the bottom surface of the base 108 by machining, an axis of any pin among the three pins 220 may be deviated from the axis of the through-hole 210 into which the pin 220 is inserted. If the axis of the pin 220 is deviated from the axis of the through-hole 210 into which the pin 220 is inserted, a pressing force of the pin 220 that locally compresses the first sealing member 186 acts on the first sealing member 186. When the first sealing member 186 is locally compressed, a gap may be generated between an uncompressed portion of the first sealing member 186 and the pin 220. As a result, it is difficult to sufficiently seal the through-hole 210.

Therefore, in the plasma processing apparatus 10, when the pressing force of the pin 220 that locally compresses the first sealing member 186 acts on the first sealing member 186, the second sealing member 188 allows the movable member 184 to move in a direction in which the pressing force is released. For example, it is assumed that the pressing force that locally compresses the first sealing member 186 acts in the same direction as the direction of deviation of the axis of the corresponding pin 220. In that case, the second sealing member 188 slides along the upper surface 182a of the recess 182 in the same direction as the direction of the deviation of the axis of the pin 220, thereby allowing the movement of the movable member 184.

Accordingly, the pressing force that locally compresses the first sealing member 186 is released, and no gap is generated between an uncompressed portion of the first sealing member 186 and the pin 220. As a result, in the plasma processing apparatus 10, the through-hole 210 can be adequately sealed with the first sealing member 186 and the second sealing member 188 even when the axis of the through-hole 210 of the first mounting table 102 and the axis of the pin 220 are deviated from each other.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A plasma processing apparatus comprising:
a plasma processing chamber;
a wafer stage disposed in the plasma processing chamber, the wafer stage having a plurality of through holes extending in a vertical direction, each through hole including a through hole assembly, each through hole assembly comprising:
an annular recess extending from a side surface of the through hole, the annular recess including an upper surface and a lower surface;
a pin disposed in the through-hole;
an annular member disposed between the upper surface and the lower surface of the annular recess, the annular member having an inner upper surface, an inner horizontal surface and an inner lower surface, the inner upper surface extending upward from an inner end of the inner horizontal surface, the inner lower surface extending downward from an outer end of the inner horizontal surface, the annular member having an outer upper surface, an outer horizontal surface and an outer lower surface, the outer upper surface extending upward from an inner end of the outer horizontal surface, the outer lower surface extending downward from an outer end of the outer horizontal surface;
a first annular sealing member disposed between the pin and the annular member, the first annular sealing member being disposed between the pin and the inner lower surface of the annular member; and
a second annular sealing member disposed between the outer horizontal surface of the annular member and the upper surface of the annular recess, wherein the apparatus further includes one or more actuators configured to vertically move the pin of each of the through hole assemblies.

2. The plasma processing apparatus of claim 1, wherein the second annular sealing member is disposed so as to surround the outer upper surface of the annular member.

3. The plasma processing apparatus of claim 2, wherein an inner diameter of the inner lower surface of the annular member is greater than an inner diameter of the inner upper surface of the annular member, and
the first annular sealing member is disposed below the inner upper surface of the annular member.

4. The plasma processing apparatus of claim 3, wherein an outer diameter of the outer lower surface of the annular member is greater than an outer diameter of the outer upper surface of the annular member.

5. The plasma processing apparatus of claim 4, wherein a gap is formed between the outer lower surface of the annular member and the annular recess.

6. The plasma processing apparatus of claim 5, wherein the first annular sealing member is an O-ring.

7. The plasma processing apparatus of claim 6, wherein the second annular sealing member is an O-ring.

8. The plasma processing apparatus of claim 1, wherein a gap is formed between the outer lower surface of the annular member and the annular recess.

9. The plasma processing apparatus of claim 1, wherein the first annular sealing member is an O-ring.

10. The plasma processing apparatus of claim 1, wherein the second annular sealing member is an O-ring.

11. A plasma processing apparatus comprising:
a plasma processing chamber;
a wafer stage disposed in the plasma processing chamber, the wafer stage including a base, an electrostatic chuck and a ring, the base having a central portion and a flange portion, the electrostatic chuck being disposed on the central portion, the ring being disposed so as to surround a wafer (W) placed on the electrostatic chuck, the flange portion being disposed below the ring, the flange portion having a plurality of through holes extending in a vertical direction, each through hole including a through hole assembly, each through hole assembly comprising:
an annular recess extending from a side surface of the through hole, the annular recess including an upper surface and a lower surface;
a pin disposed in the through-hole;
an annular member disposed between the upper surface and the lower surface of the annular recess, the annular member having an inner upper surface, an inner horizontal surface and an inner lower surface, the inner upper surface extending upward from an inner end of the inner horizontal surface, the inner lower surface extending downward from an outer end of the inner horizontal surface, the annular member having an outer upper surface, an outer horizontal surface and an outer lower surface, the outer upper surface extending upward from an inner end of the outer horizontal surface, the outer lower surface extending downward from an outer end of the outer horizontal surface;
a first annular sealing member disposed between the pin and the annular member, the first annular sealing member being disposed between the pin and the inner lower surface of the annular member; and
a second annular sealing member disposed between the outer horizontal surface of the annular member and the upper surface of the annular recess,
wherein the apparatus further includes one or more actuators configured to vertically move the pin of each of the through hole assemblies.

12. The plasma processing apparatus of claim 11, wherein the plurality of through holes include three through holes disposed at a regular interval in a circumferential direction of the flange portion.

13. The plasma processing apparatus of claim 12, wherein the ring is made of silicon, quartz or silicon carbide.

14. The plasma processing apparatus of claim 11, wherein the flange portion is integrated with the central portion.

* * * * *